(12) United States Patent
Chen et al.

(10) Patent No.: US 10,274,009 B2
(45) Date of Patent: Apr. 30, 2019

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chun-Yi Ho, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 15/684,954

(22) Filed: Aug. 24, 2017

(65) Prior Publication Data
US 2018/0202490 A1    Jul. 19, 2018

(30) Foreign Application Priority Data
Jan. 19, 2017 (TW) .............................. 106102293 A (51) Int. Cl.
| F16C 29/00 | (2006.01) |
| F16C 29/10 | (2006.01) |
| H05K 7/18 | (2006.01) |
| H05K 7/14 | (2006.01) |

(52) U.S. Cl.
CPC ........... *F16C 29/10* (2013.01); *H05K 7/1489* (2013.01); *H05K 7/183* (2013.01); *F16C 2380/00* (2013.01)

(58) Field of Classification Search
CPC ......... A47B 88/50; A47B 88/53; A47B 88/57; A47B 88/487; A47B 88/493
USPC ....................................... 312/334.44, 334.47
See application file for complete search history.

(56) References Cited

U.S. PATENT DOCUMENTS

| 6,367,899 | B1 * | 4/2002 | Hwang | ................ | A47B 88/493 |
| | | | | | 312/334.44 |
| 6,749,276 | B2 * | 6/2004 | Judge | .................... | A47B 88/493 |
| | | | | | 312/334.11 |
| 6,851,774 | B2 | 2/2005 | Chen | | |
| 6,935,710 | B2 | 8/2005 | Chen | | |
| 6,945,619 | B1 * | 9/2005 | Chen | .................... | A47B 88/487 |
| | | | | | 312/334.44 |
| 7,744,174 | B2 * | 6/2010 | Peng | ...................... | A47B 88/40 |
| | | | | | 312/333 |
| 7,918,517 | B2 * | 4/2011 | Chen | ...................... | A47B 88/57 |
| | | | | | 312/334.46 |

(Continued)

*Primary Examiner* — Matthew W Ing
(74) *Attorney, Agent, or Firm* — Winston Hsu (57) ABSTRACT

A slide rail assembly includes a first rail, a second rail and a working member. The first rail includes a blocking feature. The second rail is movable relative to the first rail. The working member is configured to be switched between a first state and a second state and includes a first blocking part and a second blocking part. When the second rail is located at an extension position and the working member is in the first state, the first blocking part corresponds to the blocking feature. When the working member is operated to be in the second state, the second blocking part corresponds to the blocking feature, to allow the second rail to be moved from the extension position to a predetermined position, in order to keep a distance between a front part of the second rail and a front part the first rail.

11 Claims, 10 Drawing Sheets

(56) References Cited

U.S. PATENT DOCUMENTS

| | | | |
|---|---|---|---|
| 8,007,060 B2 * | 8/2011 | Duan | H05K 7/1489 312/333 |
| 2008/0111457 A1 * | 5/2008 | Ji | A47B 88/493 312/334.44 |
| 2013/0259411 A1 | 10/2013 | Judge | |

* cited by examiner

SLIDE RAIL ASSEMBLY

BACKGROUND OF THE INVENTION

1. Field of the Invention

The present invention relates to a slide rail assembly, and more particularly, to a slide rail assembly with a safety mechanism to protect a user from being pinched when a slide rail is retracted relative to another slide rail.

2. Description of the Prior Art

Figure 1:
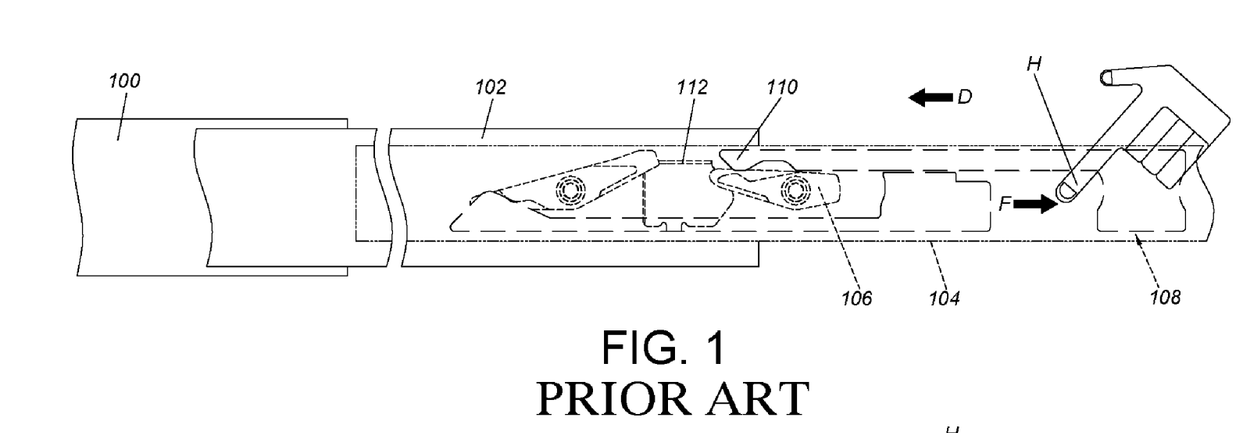
FIG. 1 is a diagram showing a slide rail assembly of the prior art, wherein a rotatable blocking member is rotated by a user through an operating member, to retract a slide rail relative to another slide rail from an extension position along one direction.
Figure 2:
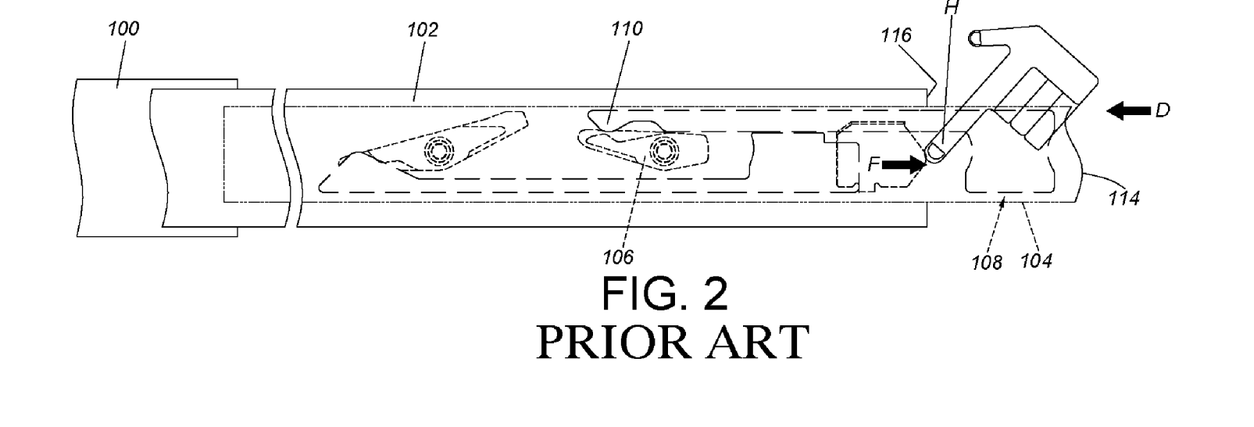
FIG. 2 is a diagram showing the slide rail assembly of the prior art, wherein the slide rail is able to be retracted relative to another slide rail from the extension position along the direction.

As shown in FIG. 1 and FIG. 2, a slide rail assembly of the prior art usually comprises a first rail 100 and a second rail 104 movable relative to the first rail 100. Preferably, the slide rail assembly further comprises a third rail 102 arranged between the first rail 100 and the second rail 104 to increase a traveling distance of the second rail 104 relative to the first rail 100.

Wherein, a blocking base 112 is arranged on the third rail 102 and located adjacent to a front part 116 of the third rail 102. On the other hand, a rotatable blocking member 106 and an operating member 108 are arranged on the second rail 104. Wherein, when the second rail 104 is located at an extension position relative to the third rail 102, the second rail 104 is fixed relative to the third rail 102. Moreover, a hand H of a user can apply a force F to the operating member 108, such that a driving part 110 of the operating member 108 drives the rotated blocking member 106 to rotate, in order to stop the blocking base 112 of the third rail 102 from blocking the rotatable blocking member 106. As such, the second rail 104 is able to be retracted relative to the third rail 102 from the extension position along a retracting direction D. Wherein, in a process of retracting the slide rail assembly, if the hand H of the user does not release or move away from the operating member 108 in proper time, the hand H of the user may be pinched at some position between a front part 114 of the second rail 104 and the front part 116 of the third rail 102. In other words, the slide rail assembly of the prior art does not have a safety mechanism to protect the user from being pinched.

SUMMARY OF THE INVENTION

An objective of the present invention is to provide a slide rail assembly with a safety mechanism capable of protecting a user from being pinched when a slide rail is retracted relative another slide rail.

According to an embodiment of the present invention, a slide rail assembly comprises a first rail, a second rail and a first working member. The first rail comprises a blocking feature. The second rail is movable relative to the first rail between a retracted position and an extension position. The first working member is configured to be operated between a first state and a second state relative to the second rail. The first working member comprises a first blocking part and a second blocking part. Wherein, when the second rail is located at the extension position and the first working member is in the first state, the first blocking part of the first working member is located a position corresponding to the blocking feature of the first rail and configured to abut against the blocking feature, in order to prevent the second rail from being moved from the extension position toward the retracted position. Wherein, when the first working member is operated in the second state, the first blocking part of the first working member is located at a position not corresponding to the blocking feature of the first rail to allow the second rail to be moved from the extension position toward the retracted position, and the second blocking part of the first working member is located at a position corresponding to the blocking feature of the first rail and configured to abut against the blocking feature, in order to prevent the second rail from being moved from a predetermined position toward the retracted position, the predetermined position is between the extension position and the retracted position. Wherein, when the second rail is located at the predetermined position and the first working member is in the first state, the second blocking part of the first working member is located at a position not corresponding to the blocking feature of the first rail to allow the second rail to be retracted from the predetermined position to the retracted position.

Preferably, the first working member is pivoted to the second rail by a shaft member, and the shaft member is located between the first blocking part and the second blocking part.

Preferably, the slide rail assembly further comprises a base, and the base comprises a first elastic part configured to provide an elastic force to a portion of the first working member adjacent to the first blocking part.

Preferably, the slide rail assembly further comprises a first operating member configured to be operated to switch the first working member from the first state to the second state.

Preferably, the slide rail assembly further comprises a first recovery elastic member configured to provide an elastic force to the first operating member.

Preferably, the slide rail assembly further comprises a second working member pivoted to the second rail, the second working member comprises a third blocking part, wherein when the second rail is located at the extension position, the third blocking part of the second working member and the first blocking member of the first working member are respectively located at two opposite sides of the blocking feature.

Preferably, the base further comprises a second elastic part configured to provide an elastic force to a portion of the second working member adjacent to the third blocking part.

Preferably, the slide rail assembly further comprises a second operating member configured to be operated to rotate the second working member relative to the second rail.

Preferably, the slide rail assembly further comprises a second recovery elastic member configured to provide an elastic force to the second operating member.

Preferably, the slide rail assembly further comprises a third rail, wherein the first rail is arranged between the third rail and the second rail.

According to another embodiment of the present invention, a slide rail assembly comprises a first rail, a second rail, a first working member and a base. The first rail comprises a blocking feature. The second rail is movable relative to the first rail. The first working member is pivoted to the second rail by a pivoting feature. The first working member comprises a first blocking part and a second blocking part. The pivoting feature is located between the first blocking part and the second blocking part. The base comprises a first elastic part configured to provide an elastic force to the first working member. Wherein, when the second rail is located at an extension position relative to the first rail, the first blocking part of the first working member is located at a position corresponding to the blocking feature of the first rail in response to the elastic force of the first elastic part of the base and configured to abut against the blocking feature, in order to prevent the second rail from being retracted from the extension position toward the retracted position. Wherein, when the first working member is operated to move the first blocking part of the first working member to a position not corresponding to the blocking feature of the first rail, the elastic force of the first elastic part of the base is suppressed, and the second blocking part of the first working member is located at a position corresponding to the blocking feature of the first rail and configured to abut against the blocking feature, in order to prevent the second rail from being retracted from a predetermined position toward the retracted position, the predetermined position is between the extension position and the retracted position.

According to yet another embodiment of the present invention, a slide rail assembly comprises a first rail, a second rail and a first working member. The first rail comprises a front part, a rear part and a blocking feature located between the front part and the rear part. The second rail is movable relative to the first rail between an extension position and a retracted position. The second rail comprises a front part and a rear part. The first working member is configured to be operated between a first state and a second state relative to the second rail. The first working member comprises a first blocking part and a second blocking part. Wherein, when the second rail is located at the extension position and the first working member is in the first state, the first blocking part of the first working member is configured to be blocked by the blocking feature of the first rail. Wherein, when the first working member is operated to be in the second state, the first blocking part of the first working member is not configured to be blocked by the blocking feature of the first rail, and the second blocking part of the first working member is configured to be blocked by the blocking feature of the first rail, in order to allow the second rail to be moved from the extension position to a predetermined position relative to the first rail, so as to keep a predetermined distance between the front part of the second rail and the front part of the first rail, the predetermined position is between the extension position and the retracted position.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
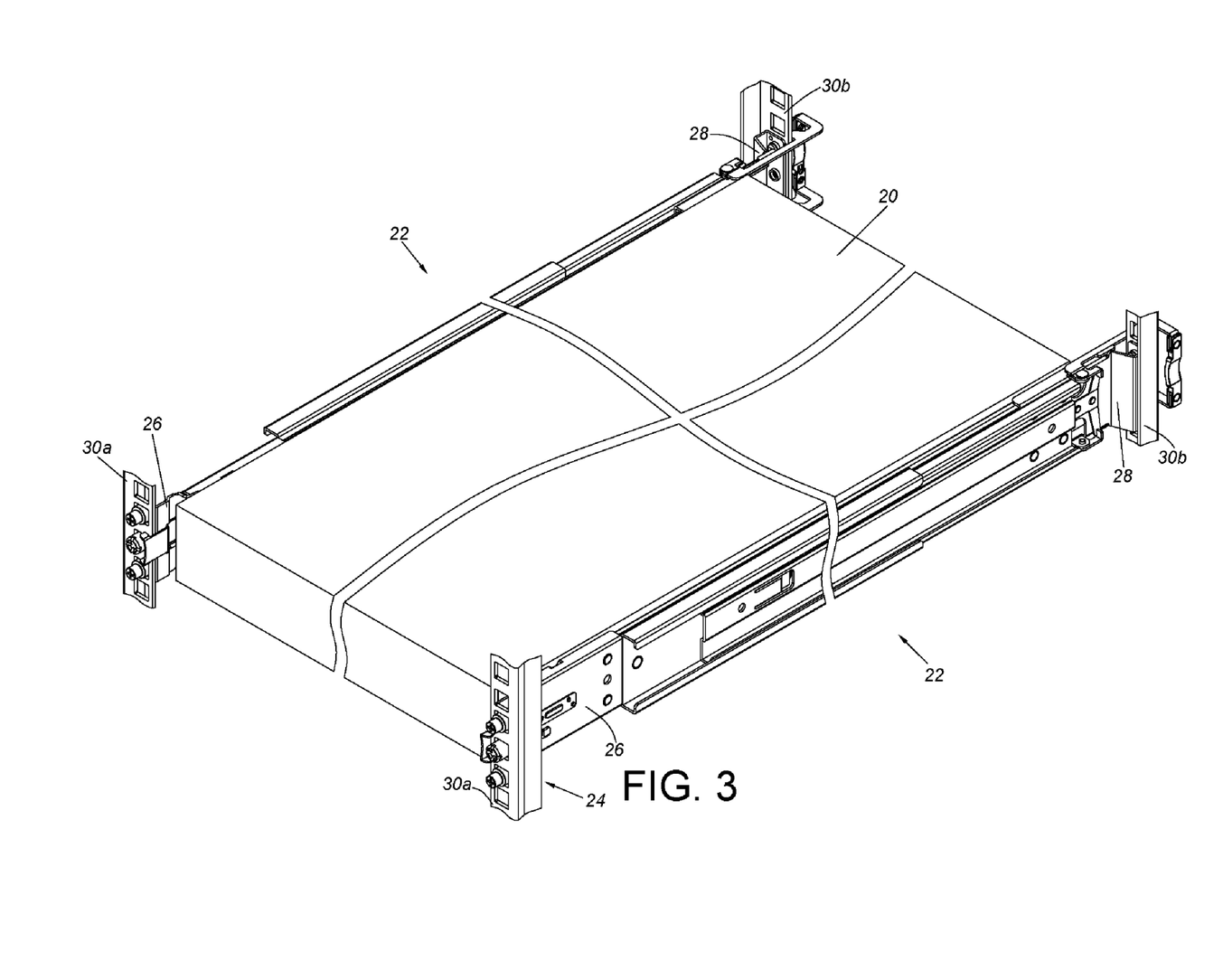
FIG. 3 is a diagram showing a carried object mounted to a rack through a pair of slide rail assemblies according to an embodiment of the present invention.

As shown in FIG. 3, a carried object 20 is able to be mounted to a rack 24 through a pair of slide rail assemblies 22. Specifically, the carried object 20 can be an electronic apparatus (such as a server) or a chassis. Each of the slide rail assemblies 22 is configured to be mounted to a first post 30*a* and a second post 30*b* of the rack 24 through a first bracket 26 and a second bracket 28 respectively.

Figure 4:
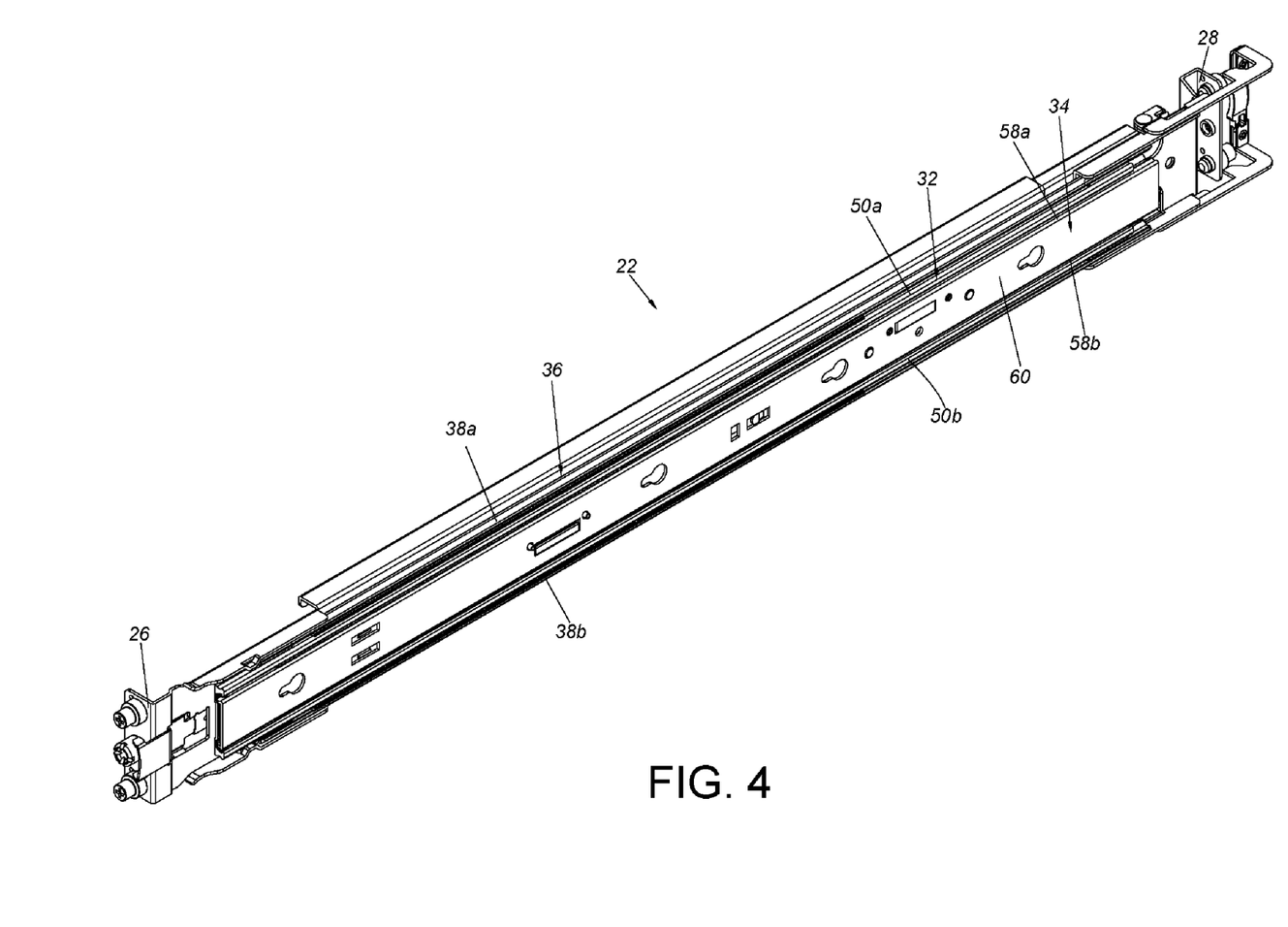
FIG. 4 is a diagram showing the slide rail assembly comprising a first rail, a second rail and a third rail according to an embodiment of the present invention.
Figures 5, 6:
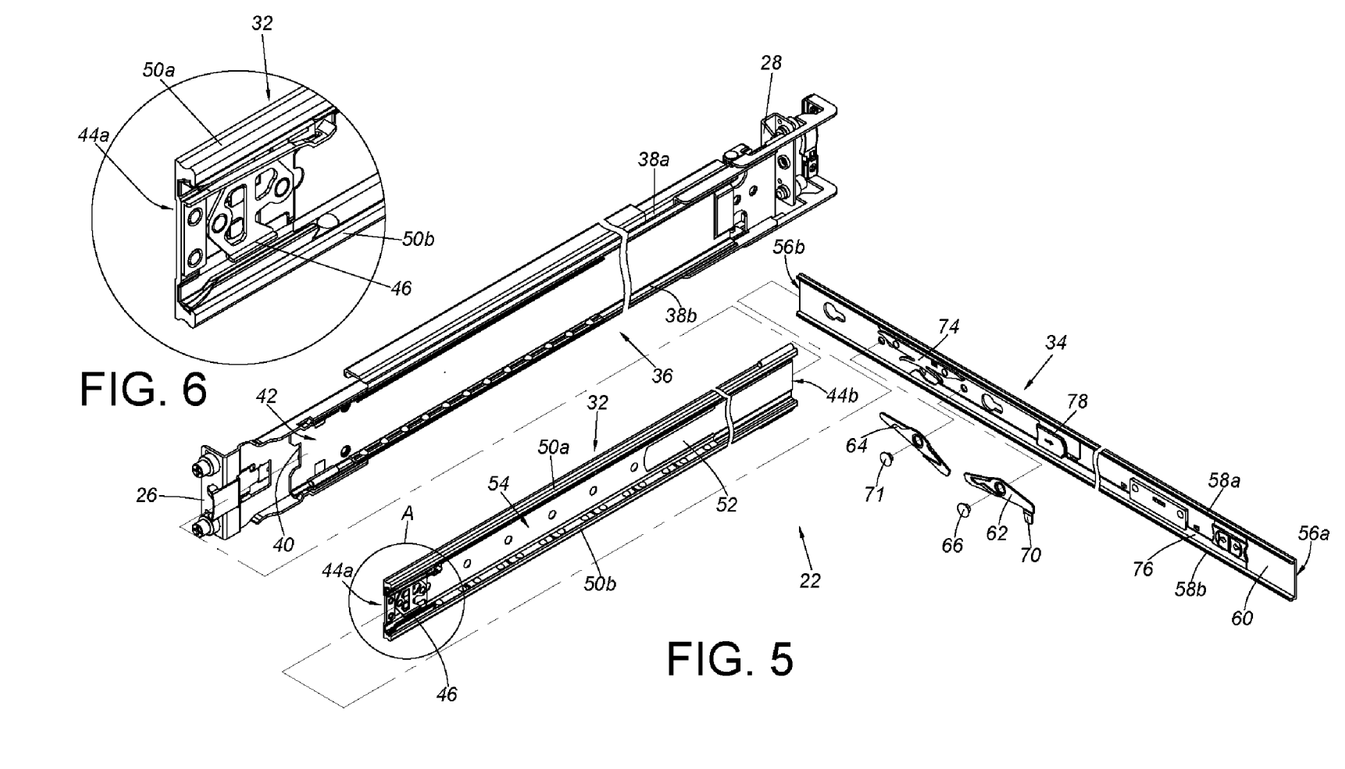
FIG. 5 is an exploded view of the slide rail assembly according to an embodiment of the present invention.
FIG. 6 is an enlarged view of an area A of FIG. 5.

As shown in FIG. 4 and FIG. 5, the slide rail assembly 22 comprises a first rail 32 and a second rail 34. Preferably, the slide rail assembly 22 further comprises a third rail 36. Wherein, the first rail 32 is arranged between the third rail 36 and the second rail 34.

The first bracket 26 and the second bracket 28 are respectively arranged on two parts (such as a front part and a rear part) of the third rail 36. Moreover, the third rail 36 comprises an upper wall 38*a*, a lower wall 38*b* and a side wall 40 connected between the upper wall 38*a* and the lower wall 38*b*. The upper wall 38*a*, the lower wall 38*b* and the side wall 40 of third rail 36 define a passage 42. The first rail 32 is configured to be installed into the passage 42.

The first rail 32 is movable relative to the third rail 36 through the passage 42 of the third rail 36. The first rail 32 has a front part 44*a*, a rear part 44*b* and a blocking feature 46 located between the front part 44*a* and the rear part 44*b*. The blocking feature 46 can be a protrusion. In the present embodiment, the blocking feature 46 is located adjacent to the front part 44*a* of the first rail 32 (please refer to FIG. 6). Wherein, the blocking feature 46 can be an additional accessory connected to the first rail 32, or the blocking feature 46 and the first rail 32 can be integrally formed in one piece, the present invention is not limited thereto. Moreover, the first rail 32 comprises an upper wall 50*a*, a lower wall 50*b* and a side wall 52 connected between the upper wall 50*a* and the lower wall 50*b*. The upper wall 50*a*, the lower wall 50b and the side wall 52 of the first rail 32 define a passage 54. The second rail 34 is configured to be installed into the passage 54.

The second rail 34 is movable relative to the first rail 32 and/or the third rail 36 through the passage 54 of the first rail 32. The second rail 34 has a front part 56a and a rear part 56b. Moreover, the second rail 34 comprises an upper wall 58a, a lower wall 58b and a side wall 60 connected between the upper wall 58a and the lower wall 58b.

The slide rail assembly 22 further comprises a first working member 62. Preferably, the slide rail assembly 22 further comprises a second working member 64. Specifically, the first working member 62 is pivoted to the second rail 34 by a pivoting feature 66. In the present embodiment, the first working member 62 is pivoted to the side wall 60 of the second rail 34. Wherein, the pivoting feature 66 can be a shaft member, and the first working member 62 is pivoted to the second rail 34 by the shaft member; or the pivoting feature 66 can be a shaft part integrally formed on the first working member 62, such that the first working member 62 can be pivoted to the second rail 34.

Figure 7:
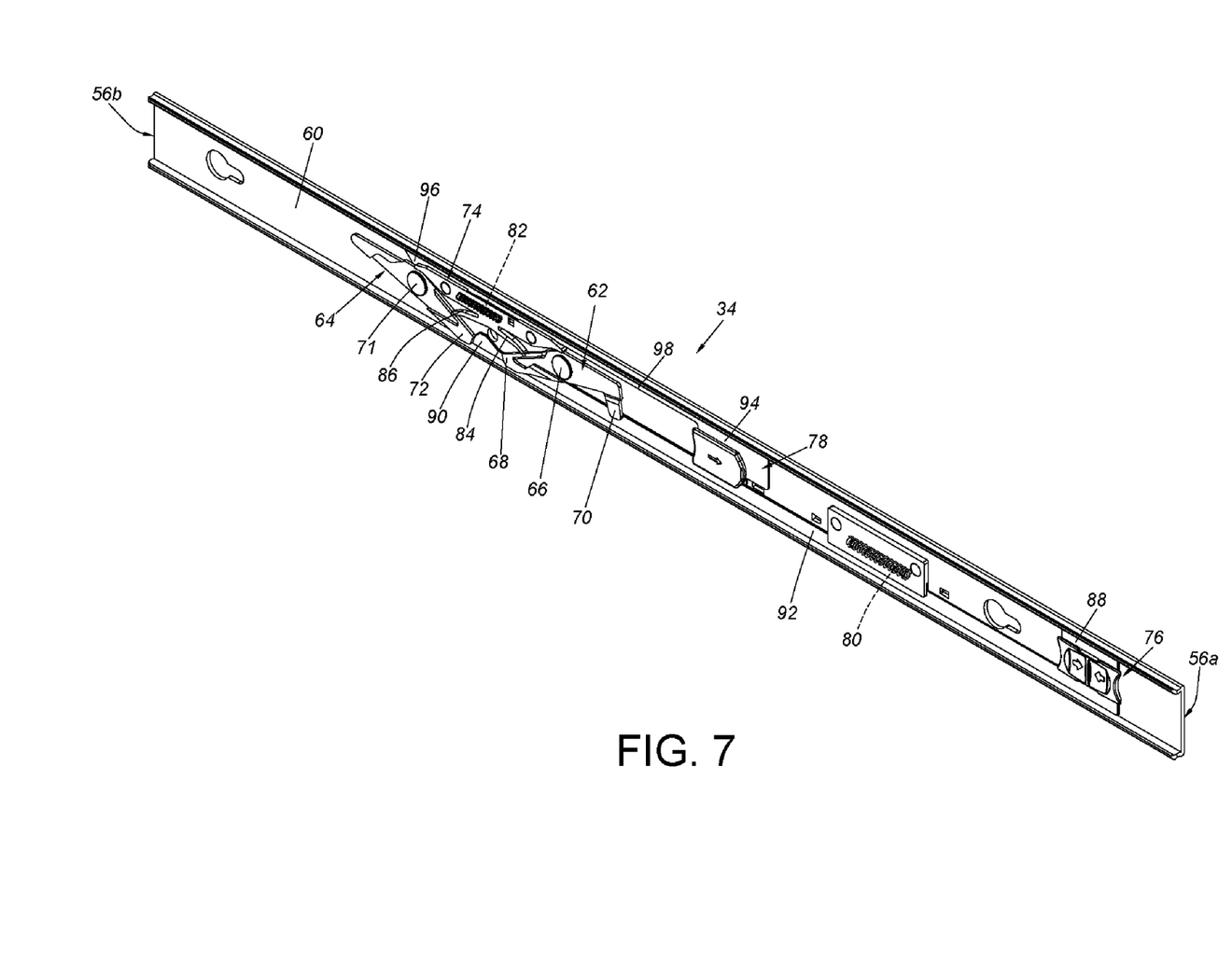
FIG. 7 is a diagram showing the second rail of the slide rail assembly according to an embodiment of the present invention.

As shown in FIG. 7, the first working member 62 comprises a first blocking part 68 and a second blocking part 70. Wherein, the second blocking part 70 can be integrally formed on the first working member 62, or the second blocking part 70 can be an additional accessory connected to the first working member 62, the present invention is not limited thereto. Preferably, the pivoting feature 66 (such as the shaft member) is located between the first blocking part 68 and the second blocking part 70. On the other hand, the second working member 64 is pivoted to the second rail 34 by a pivoting feature 71 (such as a shaft member). In the present embodiment, the second working member 64 is pivoted to the side wall 60 of the second rail 34, and the second working member 64 comprises a third blocking part 72.

Preferably, the slide rail assembly 22 further comprises a base 74, a first operating member 76, a second operating member 78, a first recovery elastic member 80 and a second recovery elastic member 82.

The base 74 comprises a first elastic part 84 and a second elastic part 86 configured to provide elastic forces to the first working member 62 and the second working member 64 respectively. For example, the first elastic part 84 is configured to provide an elastic force to a portion of the first working member 62 adjacent to the first blocking part 68, and the second elastic part 86 is configured to provide an elastic force to a portion of the second working member 64 adjacent to the third blocking part 72.

The first operating member 76 is configured to drive the first working member 62 to move. In the present embodiment, the first operating member 76 comprises a first operating part 88, a first driving part 90 and a first extending part 92 connected between the first operating part 88 and the first driving part 90. Wherein, the first extending part 92 is arranged substantially along a longitudinal direction of the second rail 34.

The second operating member 78 is configured to drive the second working member 64 to move. In the present embodiment, the second operating member 78 comprises a second operating part 94, a second driving part 96 and a second extending part 98 connected between the second operating part 94 and the second driving part 96. Wherein, the second extending part 98 is arranged substantially along the longitudinal direction of the second rail 34. The second operating member 78 is able to be operated to drive the second working member 64 to rotate from one state to another state through the second driving part 96.

The first recovery elastic member 80 and the second recovery elastic member 82 are configured to provide elastic forces (such as recovery elastic force) respectively to the first operating member 76 and the second operating member 78, such that the first operating member 76 and the second operating member 78 can be respectively held at predetermined operating positions in response to the elastic forces of the first recovery elastic member 80 and the second recovery elastic member 82.

Figure 8:
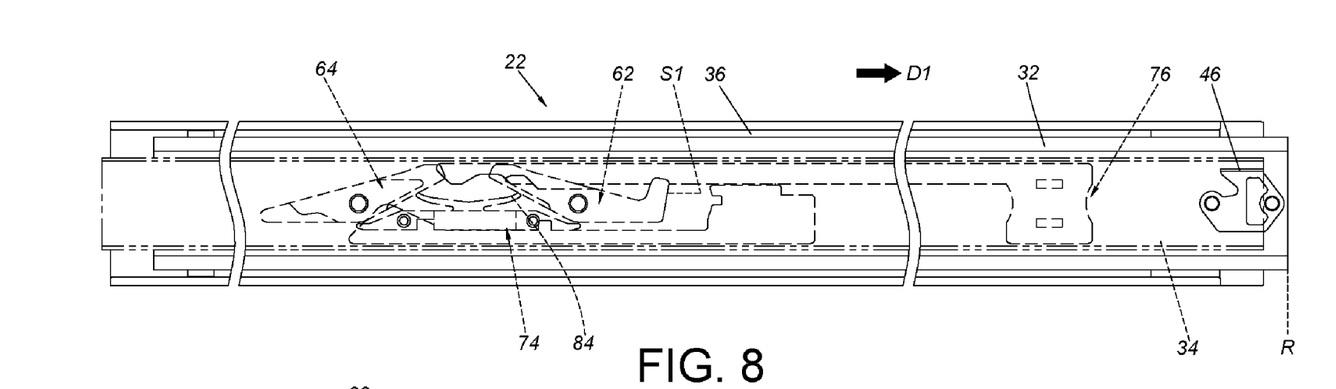
FIG. 8 is a diagram showing the slide rail assembly in a retracted state according to an embodiment of the present invention.

As shown in FIG. 8, the slide rail assembly 22 is in a retracted state. Specifically, the first rail 32 and/or the second rail 34 are retracted relative to the third rail 36, and the second rail 34 is located at a retracted position R relative to the first rail 32. Wherein, the first working member 62 is in a first state 51 relative to the second rail 34.

Figure 9:
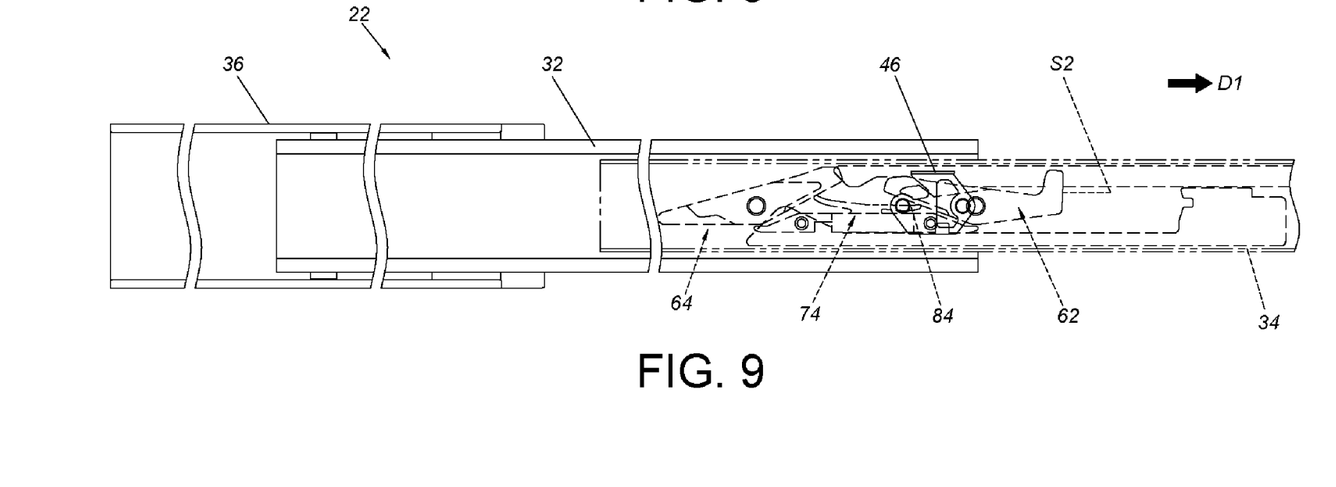
FIG. 9 is a diagram showing the first rail and the second rail of the slide rail assembly being moved relative to the third rail along an extension direction according to an embodiment of the present invention.
Figures 10, 11:
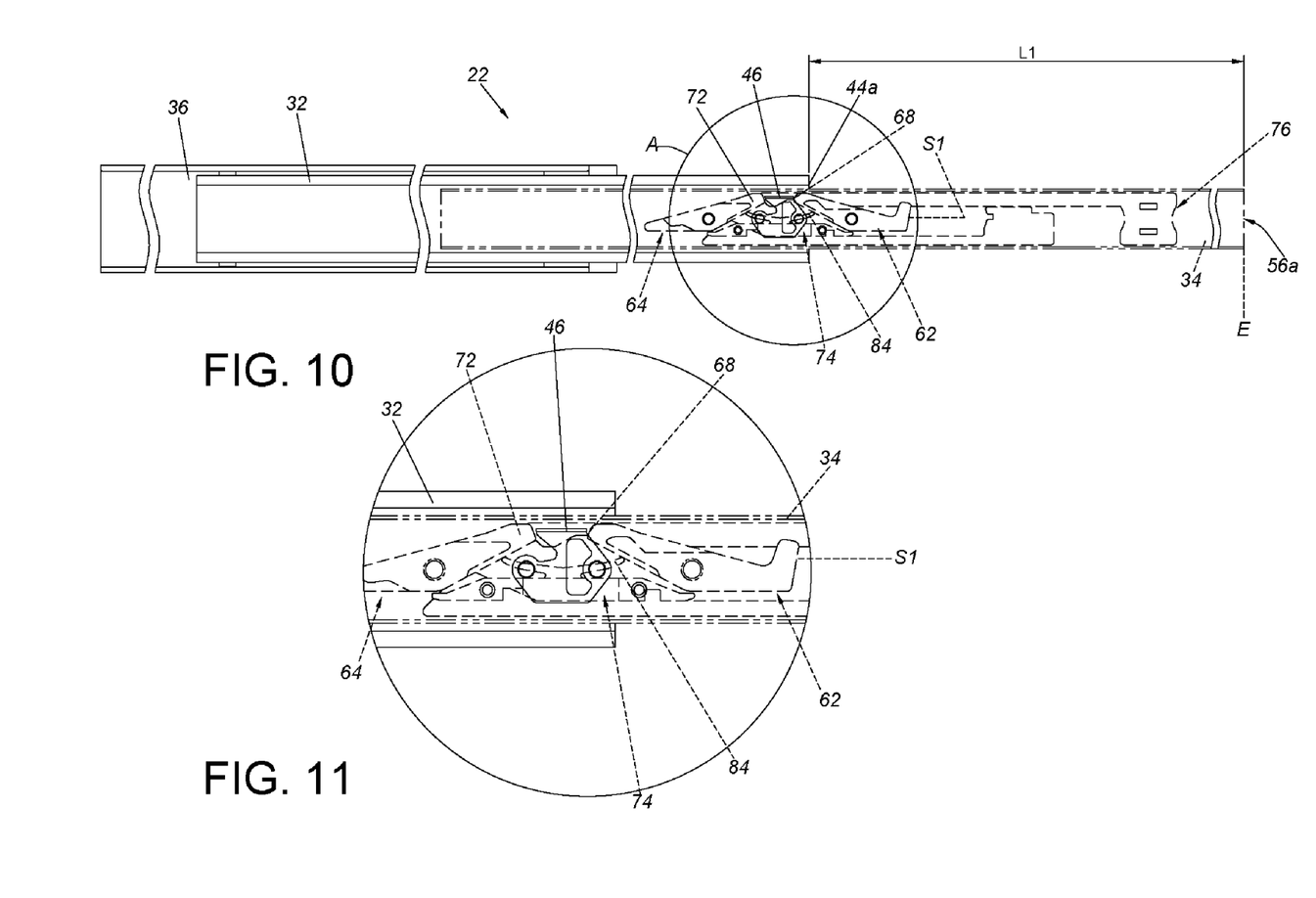
FIG. 10 is a diagram showing the second rail of the slide rail assembly located at an extension position relative to the first rail according to an embodiment of the present invention.
FIG. 11 is an enlarge view of an area A of FIG. 10.

As shown in FIG. 9 and FIG. 10, the first rail 32 is moved relative to the third rail 36 along an extension direction D1. On the other hand, the second rail 34 is moved relative to the first rail 32 along the extension direction D1. Wherein, in a process of the second rail 34 being moved along the extension direction D1 to arrive at an extension position E, the first working member 62 is pressed by the blocking feature 46 of the first rail 32 to rotate to be in a second state S2, and the elastic force of the first elastic part 84 of the base 74 is suppressed by the first working member 62, such that the first working member 62 can be moved with the second rail 34 along the extension direction D1 to cross the blocking feature 46.

As shown in FIG. 10 and FIG. 11, after the first working member 62 crosses the blocking feature 46, the first working member 62 is returned to the first state S1, such that the first blocking part 68 is located at a position corresponding to the blocking feature 46 of the first rail 32. On the other hand, the second rail 34 is located at the extension position E relative to the first rail 32. Wherein, when the second rail 34 is located at the extension position E, the first blocking part 68 of the first working member 62 and the third blocking part 72 of the second working member 64 are respectively located at two opposite sides of the blocking feature 46, such that the second rail 34 is not arbitrarily movable relative to the first rail 32. Wherein, the first blocking part 68 of the first working member 62 is located at a position corresponding to the blocking feature 46, in order to prevent the second rail 34 from being retracted from the extension position E to the retracted position R. For example, when the second rail 34 is located at the extension position E and the first working member 62 is in the first state S1, the first blocking part 68 of the first working member 62 is configured to be blocked by (or abut against) the blocking feature 46 of the first rail 32, such that a first distance L1 is kept between the front part 56a of the second rail 34 and the front part 44a of the first rail 32.

Figures 12, 13:
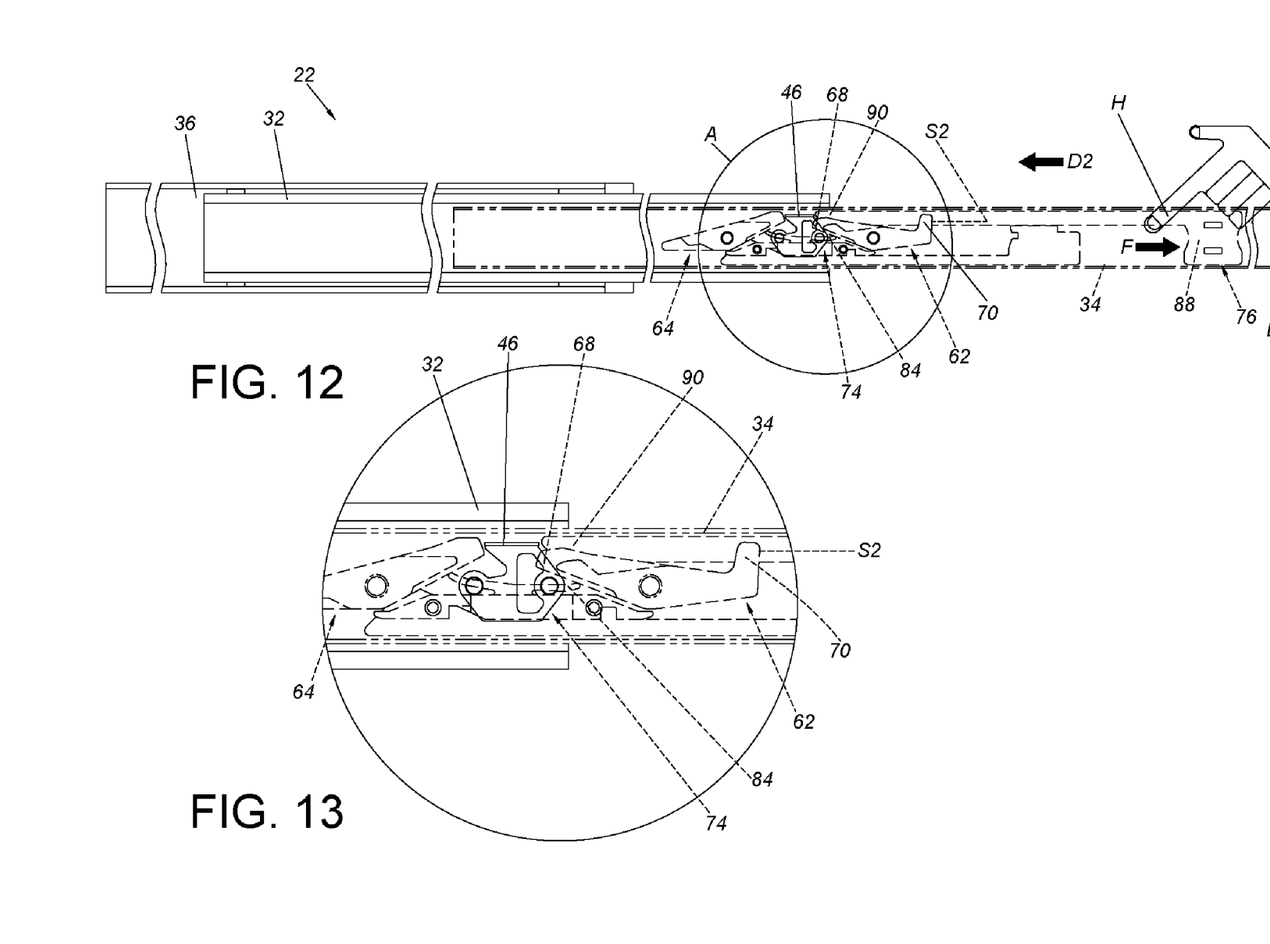
FIG. 12 is a diagram showing the second rail of the slide rail assembly located at the extension position relative to the first rail with a first operating member being operated by a user according to an embodiment of the present invention.
FIG. 13 is an enlarge view of an area A of FIG. 12.

As shown in FIG. 10, FIG. 12 and FIG. 13, when a user is going to retract the second rail 34 relative to the first rail 32 from the extension position E toward the retracted position R along a retracing direction D2, the user operate the first working member 62 to switch from the first state S1 to the second state S2, such that the first blocking part 68 of the first working member 62 is located at a position not corresponding to the blocking feature 46 of the first rail 32. In the present embodiment, the user can operate the first working member 62 to switch from the first state S1 to the second state S2 through the first operating member 76. For example, the user can apply a force F by hand H to the first operating part 88 of the first operating member 76, such that the first driving part 90 further drives the first working member 62 to rotate relative to the second rail 34, in order to switch the first working member 62 from the first state S1 to the second state S2 with the elastic force of the first elastic part 84 of the base 74 being suppressed.

Figures 14, 15:
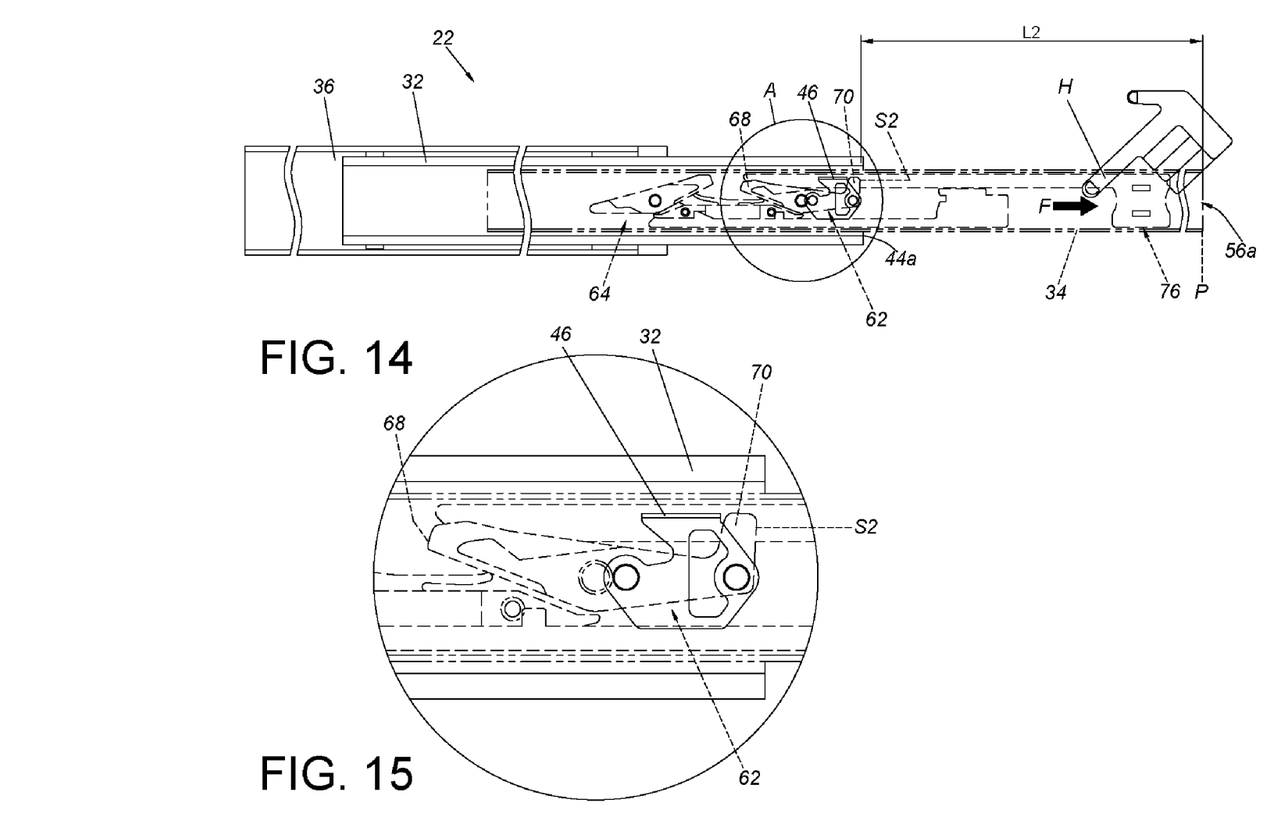
FIG. 14 is a diagram showing the second rail of the slide rail assembly located at a predetermined position relative to the first rail according to an embodiment of the present invention.
FIG. 15 is an enlarge view of an area A of FIG. 14.

As shown in FIG. 12, FIG. 14 and FIG. 15, when the user applies the force F to the first operating member 76 and the first working member 62 is in the second state S2, the first blocking part 68 is located at a position not corresponding to the blocking feature 46 of the first rail 32, and the second rail 34 is able to be retracted relative to the first rail 32 from the extension position E toward the retracted position R along the retracing direction D2. Wherein, when the second rail 34 is located at a predetermined position P between the extension position E and the retracted position R, the second blocking part 70 of the first working member 62 is located at a position corresponding to the blocking feature 46 of the first rail 32, in order to prevent the second rail 34 from being retracted relative to the first rail 32 from the predetermined position P toward the retracted position R. For example, when the first working member 62 is in the second state S2, the first blocking part 68 of the first working member 62 is not configured to be blocked by the blocking feature 46 of the first rail 32, and the second blocking part 70 of the first working member 62 is configured to be blocked by (or abut against) the blocking feature 46, such that the second rail 34 is able to be retracted from the extension position E to the predetermined position P, in order to keep a second distance L2 between the front part 56a of the second rail 34 and the front part 44a of the first rail 32. Wherein, the second distance L2 is smaller than the first distance L1.

According to the above arrangement, the second distance L2 is kept between the front part 56a of the second rail 34 and the front part 44a of the first rail 32 as a safe distance, in order to prevent the hand H of the user from being pinched at a position between the front part 56a of the second rail 34 and the front part 44a of the first rail 32 when the second rail 34 is retracted relative to the first rail 32 from the predetermined position P. In other words, the second rail 34 is unable to be retracted relative to the first rail 32 from the predetermined position P until the hand H of the user releases or moves away from the first operating member 76, so as to prevent the hand H of the user from being pinched.

Figure 16:
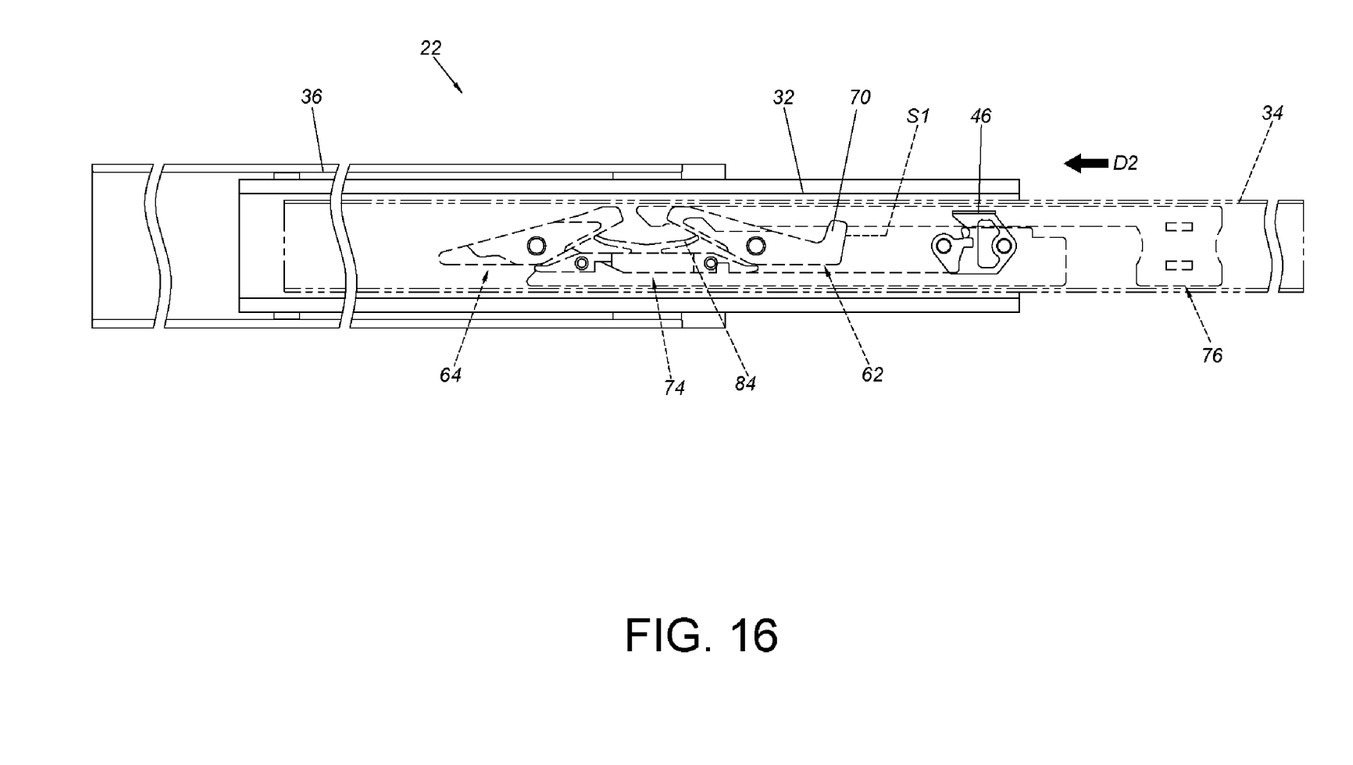
FIG. 16 is a diagram showing the second rail of the slide rail assembly being retracted along a retracing direction relative to the first rail or the third rail according to an embodiment of the present invention.

As shown in FIG. 14 and FIG. 16, when the user no longer applies the force F to the first operating member 76, the first working member 62 is rotated to return to the first state S1 from the second state S2 in response to the elastic force of the first elastic part 84 of the base 74, such that the second blocking part 70 of the first working member 62 is located at a position not corresponding to the blocking feature 46 of the first rail 32, in order to allow the second rail 34 to be retracted from the predetermined position P to the retracted position R along the retracing direction D2.

Therefore, the slide rail assembly of the present invention is characterized in that:

1. When the second rail of the slide rail assembly is retracted from the extension position relative to the first rail, the second blocking part of the first working member can be blocked by or abut against the blocking feature, such that a predetermined safe distance (such as the second distance L2) can be kept when the second rail is retracted relative to the first rail from the extension position along the retracing direction D2. The safe distance allows the hand of the user to move away from the first working member or the first operating member, in order to prevent the hand of the user from being pinched when the second rail is retracted relative to the first rail.

2. When the second rail is located at the extension position relative to the first rail, the second rail is not arbitrarily movable relative to the first rail through arranging the first working member and the second working member at two opposite sides of the blocking feature.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A slide rail assembly, comprising:
a first rail comprising a blocking feature;
a second rail movable relative to the first rail between a retracted position and an extension position;
a first working member configured to be operated between a first state and a second state relative to the second rail, the first working member comprising a main body, a first blocking part and a second blocking part, the first blocking part and the second blocking part being arranged at two opposite ends of the main body and along a longitudinal direction of the main body;
a first operating member configured to be operated to switch the first working member from the first state to the second state, the first operating member having a first extending part arranged along a longitudinal direction of the second rail;
a second working member pivoted to the second rail, the second working member comprising a third blocking part, wherein when the second rail is located at the extension position, the third blocking part of the second working member and the first blocking member of the first working member are respectively located at two opposite sides of the blocking feature; and
a second operating member configured to be operated to rotate the second working member relative to the second rail; and
a base comprising a first elastic part and a second elastic part, respectively configured to provide an elastic force to a portion of the first working member adjacent to the first blocking part and to provide an elastic force to a portion of the second working member adjacent to the third blocking part;
wherein the second blocking part protrudes from the main body toward the first extending part in a height direction perpendicular to the longitudinal direction of the main body;
wherein the base, the first elastic part and the second elastic part are a one-piece member, and the one-piece member is arranged between the first working member and the second working member;
wherein the second working member is independently rotatable relative to the first working member;
wherein when the second rail is located at the extension position and the first working member is in the first state, the first blocking part of the first working member is located a position corresponding to the blocking feature of the first rail and configured to abut against the blocking feature, in order to prevent the second rail from being moved from the extension position toward the retracted position;
wherein when the first working member is operated in the second state, the first blocking part of the first working member is located at a position not corresponding to the blocking feature of the first rail to allow the second rail to be moved from the extension position toward the retracted position, and the second blocking part of the first working member is located at a position corresponding to the blocking feature of the first rail and configured to abut against the blocking feature, in order to prevent the second rail from being moved from a predetermined position toward the retracted position, the predetermined position is between the extension position and the retracted position;

wherein when the second rail is located at the predetermined position and the first working member is in the first state, the second blocking part of the first working member is located at a position not corresponding to the blocking feature of the first rail to allow the second rail to be retracted from the predetermined position to the retracted position.

2. The slide rail assembly as claim 1, wherein the first working member is pivoted to the second rail by a shaft member, and the shaft member is located between the first blocking part and the second blocking part.

3. The slide rail assembly as claim 1, further comprising a first recovery elastic member configured to provide an elastic force to the first operating member.

4. The slide rail assembly as claim 1, further comprising a second recovery elastic member configured to provide an elastic force to the second operating member.

5. The slide rail assembly as claim 1, further comprising a third rail, wherein the first rail is arranged between the third rail and the second rail.

6. A slide rail assembly, comprising:
a first rail comprising a blocking feature;
a second rail movable relative to the first rail;
a first working member pivoted to the second rail by a pivoting feature, the first working member comprising a main body, a first blocking part and a second blocking part, the pivoting feature located between the first blocking part and the second blocking part, the first blocking part and the second blocking part being arranged at two opposite ends of the main body and along a longitudinal direction of the main body;
a first operating member configured to be operated to rotate the first working member relative to the second rail, the first operating member having a first extending part arranged along a longitudinal direction of the second rail;
a second working member pivoted to the second rail, the second working member comprising a third blocking part, wherein when the second rail is located at an extension position, the third blocking part of the second working member and the first blocking member of the first working member are respectively located at two opposite sides of the blocking feature;
a second operating member configured to be operated to rotate the second working member relative to the second rail; and
a base comprising a first elastic part and a second elastic part, respectively configured to provide an elastic force to the first working member and to provide an elastic force to the second working member;
wherein the second blocking part protrudes from the main body toward the first extending part in a height direction perpendicular to the longitudinal direction of the main body;
wherein the base, the first elastic part and the second elastic part are a one-piece member, and the one-piece member is arranged between the first working member and the second working member;

wherein the second working member is independently rotatable relative to the first working member;
wherein when the second rail is located at the extension position relative to the first rail, the first blocking part of the first working member is located at a position corresponding to the blocking feature of the first rail in response to the elastic force of the first elastic part of the base and configured to abut against the blocking feature, in order to prevent the second rail from being retracted from the extension position toward a retracted position;
wherein when the first working member is operated to move the first blocking part of the first working member to a position not corresponding to the blocking feature of the first rail, the elastic force of the first elastic part of the base is suppressed, and the second blocking part of the first working member is located at a position corresponding to the blocking feature of the first rail and configured to abut against the blocking feature, in order to prevent the second rail from being retracted from a predetermined position toward the retracted position, the predetermined position is between the extension position and the retracted position.

7. The slide rail assembly of claim 6, wherein the pivoting feature is a shaft member, the first working member is pivoted to the second rail by the shaft member.

8. The slide rail assembly of claim 6, further comprising a first recovery elastic member configured to provide an elastic force to the first operating member to hold the first operating member at a predetermined operating position.

9. The slide rail assembly of claim 6, further comprising a second recovery elastic member, wherein the second recovery elastic member is configured to provide an elastic force to the second operating member to hold the second operating member at a predetermined operating position.

10. A slide rail assembly, comprising:
a first rail comprising a front part, a rear part and a blocking feature located between the front part and the rear part;
a second rail movable relative to the first rail between an extension position and a retracted position, the second rail comprising a front part and a rear part; and
a first working member configured to be operated between a first state and a second state relative to the second rail, the first working member comprising a main body, a first blocking part and a second blocking part, the first blocking part and the second blocking part being arranged at two opposite ends of the main body and along a longitudinal direction of the main body;
a first operating member configured to be operated to switch the first working member from the first state to the second state, the first operating member having a first extending part arranged along a longitudinal direction of the second rail;
a second working member pivoted to the second rail, the second working member comprising a third blocking part, wherein when the second rail is located at the extension position, the third blocking part of the second working member and the first blocking member of the first working member are respectively located at two opposite sides of the blocking feature;
a second operating member configured to be operated to rotate the second working member relative to the second rail; and
a base comprising a first elastic part and a second elastic part, respectively configured to support a portion of the first working member adjacent to the first blocking part and a portion of the second working member adjacent to the third blocking part;

wherein the second blocking part protrudes from the main body toward the first extending part in a height direction perpendicular to the longitudinal direction of the main body;

wherein the base, the first elastic part and the second elastic part are a one-piece member, and the one-piece member is arranged between the first working member and the second working member;

wherein the second working member is independently rotatable relative to the first working member;

wherein when the second rail is located at the extension position and the first working member is in the first state, the first blocking part of the first working member is configured to be blocked by the blocking feature of the first rail;

wherein when the first working member is operated to be in the second state, the first blocking part of the first working member is not configured to be blocked by the blocking feature of the first rail, and the second blocking part of the first working member is configured to be blocked by the blocking feature of the first rail, in order to allow the second rail to be moved from the extension position to a predetermined position relative to the first rail, so as to keep a predetermined distance between the front part of the second rail and the front part of the first rail, the predetermined position is between the extension position and the retracted position.

11. The slide rail assembly of claim 10, wherein the first working member is pivoted to the second rail by a shaft member, and the shaft member is located between the first blocking part and the second blocking part.

* * * * *